(12) United States Patent
Gruhlke et al.

(10) Patent No.: US 7,768,084 B2
(45) Date of Patent: Aug. 3, 2010

(54) SHALLOW SEMICONDUCTOR SENSOR WITH FLUORESCENT MOLECULE LAYER THAT ELIMINATES OPTICAL AND ELECTRONIC CROSSTALK

(75) Inventors: Russell W. Gruhlke, Santa Clara, CA (US); Mark D. Crook, Windsor, CO (US); Thomas E. Dungan, Fort Collins, CO (US)

(73) Assignee: Aptina Imaging Corporation, Inc., Grand Cayman (KY)

( * ) Notice: Subject to any disclaimer, the term of this patent is extended or adjusted under 35 U.S.C. 154(b) by 275 days.

(21) Appl. No.: 11/443,162

(22) Filed: May 31, 2006

(65) Prior Publication Data
US 2007/0278607 A1 Dec. 6, 2007

(51) Int. Cl.
*H01L 31/058* (2006.01)
(52) U.S. Cl. ............... 257/431; 257/461; 257/E31.093; 250/458.1
(58) Field of Classification Search ............. 257/458, 257/461, 431, E31.093; 250/458.1
See application file for complete search history.

(56) References Cited

U.S. PATENT DOCUMENTS

| | | | |
|---|---|---|---|
| 5,512,750 A | 4/1996 | Yanka et al. | |
| 5,841,143 A * | 11/1998 | Tuma et al. | 250/458.1 |
| 5,990,506 A | 11/1999 | Fossum et al. | |
| 6,081,018 A | 6/2000 | Nakashiba et al. | |
| 6,144,035 A | 11/2000 | Piper et al. | |
| 6,300,612 B1 | 10/2001 | Yu | |
| 6,304,766 B1 | 10/2001 | Colvin, Jr. | |
| 6,421,128 B1 | 7/2002 | Salamon et al. | |
| 6,501,089 B1 | 12/2002 | Kuwabara | |
| 6,737,626 B1 * | 5/2004 | Bidermann et al. | 250/208.1 |
| 6,956,221 B2 | 10/2005 | Gruhlke | |
| 2002/0182658 A1 | 12/2002 | Polak et al. | |
| 2006/0066743 A1 * | 3/2006 | Onozawa et al. | 348/340 |

OTHER PUBLICATIONS

International Search Report, Appln. No. PCT/US07/11678, dated March 12, 2008.
Dmitruk et al., "Photosensitivity control of detectors based on surface plasmon-polariton resonance in Schottky structures", Proceedings of the 21st International Conference on Microelectronics (MIEL '97), Niš, Yugoslavia, Sep. 14-17, 1997, vol. 1, pp. 309-314, IEEE.
Dmitruk et al., "Sulfur passivation for photosensitivity control of detectors with corrugated metal—III-V semiconductors interface", Proceedings of the International Semiconductor Conference, 1997 (CAS '97), Sinaia, Romania, Oct. 7-11, 1997, vol. 1, pp. 263-266, IEEE.

(Continued)

*Primary Examiner*—Lex Malsawma
*Assistant Examiner*—Robert Huber
(74) *Attorney, Agent, or Firm*—RatnerPrestia

(57) ABSTRACT

A semiconductor sensor including a plurality of pixels, each of which includes a fluorescent molecule layer and a photosensitive layer. The fluorescent molecule layer converts light incident on the pixel to surface plasmons. The photosensitive layer generates a light detection signal representative of an intensity of light incident on the pixel in response to the surface plasmons in a region of the sensor which is close enough to the surface of the pixels that electronic crosstalk between the pixels does not occur.

10 Claims, 6 Drawing Sheets

OTHER PUBLICATIONS

"Integrated Thin-Film Fluorescence Sensor", NASA Tech Briefs, Jan. 1998, pp. 40-43 [online], [retrieved on Jan. 27, 2006]. Retrieved from the Internet: <URL: http://www.nasatech.com/Briefs/Jan98/LEW16368.html>>.

"Integrated Thin-Film Florescence Sensor", Technical Support Package, Nasa Tech Briefs, LEW-16368, Lewis Research Center, Cleveland, Ohio 44135, no date, but referenced in "Integrated Thin-Film Fluorescence Sensor", NASA Tech Briefs, Jan. 1998, pp. 40-43.

Dmitruk et al., "Influence of multilayer coating peculiarities on efficiency of surface plasmon resonance photodector", Proceedings of the International Semiconductor Conference, 1998 (CAS '98), Sinaia, Romania, Oct. 6-10, 1998, vol. 2, pp. 531-534, IEEE.

Dmitruk et al., "New advanced polaritonic photodetector on base of surface barrier structure", Proceedings of the 23rd International Conference on Microelectronics (MIEL 2002), Niš, Yugoslavia, May 12-15, 2002, pp. 313-316, IEEE.

* cited by examiner

SHALLOW SEMICONDUCTOR SENSOR WITH FLUORESCENT MOLECULE LAYER THAT ELIMINATES OPTICAL AND ELECTRONIC CROSSTALK

BACKGROUND OF THE INVENTION

There are many kinds of semiconductor sensors which have many uses. In particular, semiconductor sensors are widely used in imaging technologies such as video cameras, digital cameras, and optical navigation devices. Silicon is one example of a semiconductor that is widely used in such semiconductor sensors.

The responsivity of a semiconductor to incident light peaks in the visible light region, and decreases as wavelength increases in the infrared light region. This decrease in responsivity is accompanied by an increase in absorption depth—the longer the wavelength, the more deeply the light penetrates into the semiconductor before being absorbed. This generates both optical and electronic crosstalk.

FIG. 1 shows a portion of a semiconductor sensor 10 that includes three pixels 12, 14, and 16. The semiconductor sensor 10 may be a CMOS sensor, a CCD sensor, a v Maicovicon sensor (a trademark of Matsushita Electric Industrial Co., Ltd.), a contact sensor, or any other kind of semiconductor sensor. The basic structural details of such semiconductor sensors are known in the art, and thus are not shown in FIG. 1 for the sake of simplicity.

Ideally, a photon 18 of infrared light penetrating into the pixel 12 is absorbed in that same pixel 12 and generates an electron-hole pair consisting of an electron 20 and a hole 22 in a region of the pixel 12 where the electron 20 can be collected by a charge collecting structure of the pixel 12. Such a charge collecting structure is known in the art, and thus is not shown in FIG. 1 for the sake of simplicity.

However, a photon 24 of infrared light penetrating into the pixel 12 at a high angle of incidence relative to a normal to the surface of the pixel 12 may pass through the pixel 12 without being absorbed, and penetrate into the neighboring pixel 14 where it is absorbed and generates an electron-hole pair consisting of an electron 26 and a hole 28 in a region of the pixel 14 where the electron 26 can be collected by a charge collecting structure of the pixel 14. Such a charge collecting structure is known in the art, and thus is not shown in FIG. 1 for the sake of simplicity. This distorts the values of pixel light detection currents generated in the pixels 12 and 14, making the pixel light detection current generated in the pixel 12 smaller than it should be, and making the pixel light detection current generated in the pixel 14 larger than it should be.

This phenomenon is called optical crosstalk, and can be reduced by restricting the angles of incidence at which photons are incident on the semiconductor sensor 10 to angles of incidence near the normal to the semiconductor sensor 10. However, this typically requires one or more additional optical components, such as a collimating lens provided in front of the semiconductor sensor 10, and thus undesirably increases the cost, complexity, and size of the semiconductor sensor 10.

Furthermore, a photon 30 of infrared light may penetrate deeply into the pixel 12 before being absorbed and generating an electron-hole pair consisting of an electron 32 and a hole 34 in a region of the pixel 12 where the electron 34 cannot be collected by the charge collecting structure of the pixel 12. Instead, the electron 34 may diffuse into the neighboring pixel 16 where it may or may not be collected by a charge collecting structure of the pixel 16. Such a charge collecting is known in the art, and thus is not shown in FIG. 1 for the sake of simplicity. This distorts the light detection current generated in the pixel 12 and possibly the light detection current generated in the pixel 16, making the light detection current generated in the pixel 12 smaller than it should be, and making the light detection current generated in the pixel 16 larger than it should be if the electron 34 is collected by the charge collecting structure of the pixel 16.

This phenomenon is called electronic crosstalk, and is particularly severe in semiconductor sensors used to detect infrared light. Silicon sensors are particularly susceptible to electronic crosstalk. It is difficult to reduce electronic crosstalk, and no truly effective way of doing so has been known in the art, particularly with respect to electronic crosstalk generated by photons penetrating into the deepest parts of a pixel.

SUMMARY OF THE INVENTION

The invention relates to a shallow semiconductor sensor with a fluorescent molecule layer that eliminates optical and electronic crosstalk.

BRIEF DESCRIPTION OF THE DRAWINGS

Embodiments in accordance with the invention are described below in conjunction with the accompanying drawings of which.

DETAILED DESCRIPTION OF THE EMBODIMENTS

Figure 1:
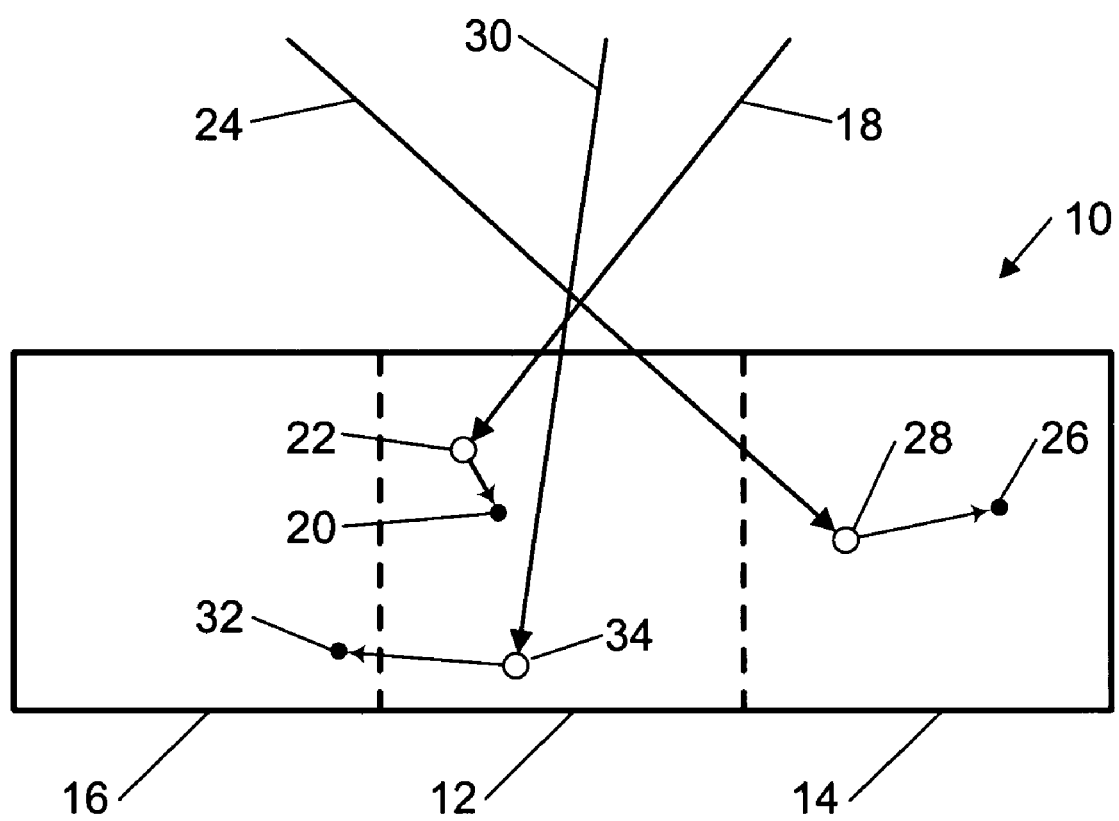
FIG. 1 shows a portion of a semiconductor sensor that is susceptible to optical and electronic crosstalk

Reference will now be made in detail to embodiments in accordance with the invention, examples of which are illustrated in the accompanying drawings, wherein like reference numerals refer to the like elements throughout. The embodiments in accordance with the invention are described below.

If there were a way to prevent infrared light from penetrating deeply into a semiconductor sensor by detecting the infrared light near the surface of the semiconductor sensor, it would be possible to eliminate optical crosstalk without using any additional optical components, and to eliminate electronic crosstalk. This can be done by using a thin layer of fluorescent molecules to generate surface plasmons in response to the infrared light at a metal/dielectric interface or a semiconductor/dielectric interface near the surface of the sensor.

Figure 2:
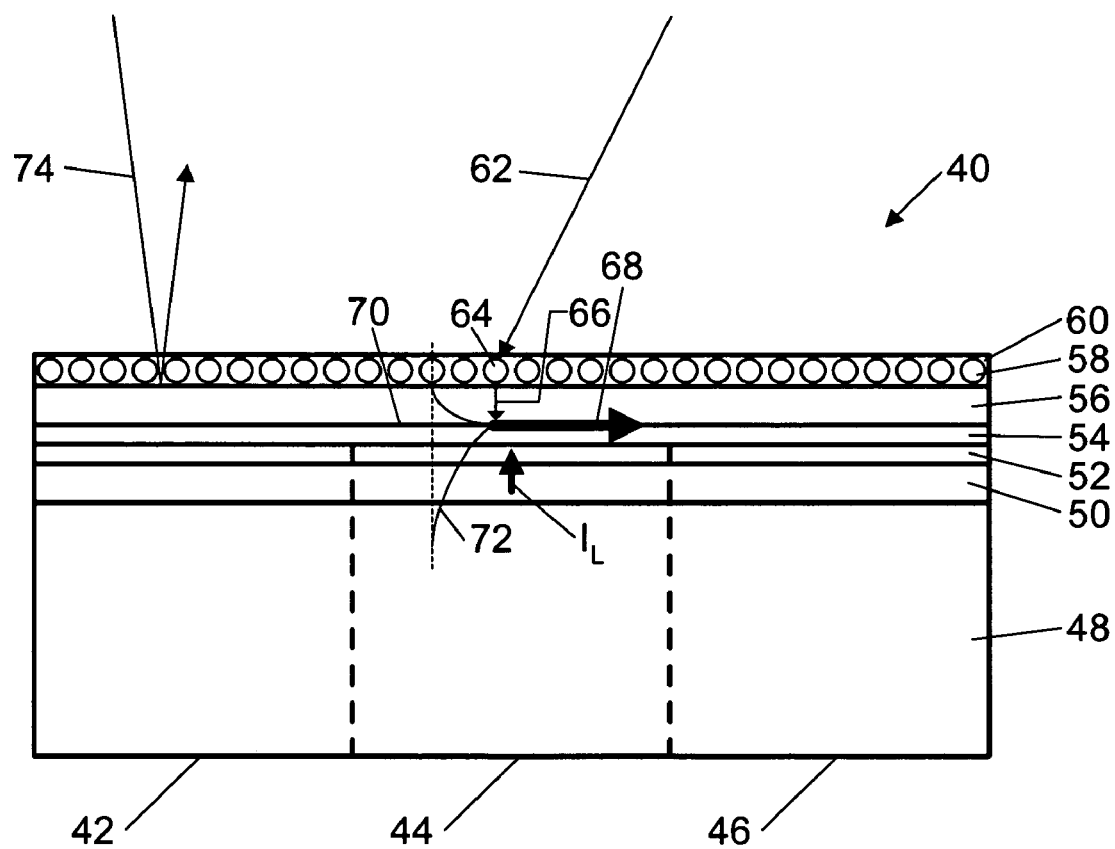
FIG. 2 shows a portion of a semiconductor sensor in accordance with the invention that eliminates optical and electronic crosstalk.

FIG. 2 conceptually shows a portion of a semiconductor sensor 40 in accordance with the invention that includes pixels 42, 44, and 46, a n-type semiconductor layer 48, a photosensitive pn junction layer 50, a p-type semiconductor layer 52, a dielectric layer 54, a metal layer 56, a fluorescent molecule layer 58, and a dielectric layer 60 in which the fluorescent molecule layer 58 is embedded.

The semiconductor sensor 40 may be a CMOS sensor, a CCD sensor, a ν Maicovicon sensor (a trademark of Matsushita Electric Industrial Co., Ltd.), a contact sensor, or any other type of semiconductor sensor. The basic structural details of such semiconductor sensors are known in the art, and thus are not shown in FIG. 2 for the sake of simplicity. Only the elements of the semiconductor sensor 40 that are necessary for understanding the invention are shown in FIG. 2.

The n-type semiconductor layer 48 and the p-type semiconductor layer 52 may be made of silicon, or any other semiconductor, appropriately doped to form n-type and p-type semiconductors. Alternatively, layer 48 may be a p-type semiconductor layer 48 and layer 52 may be an n-type semiconductor layer 52. The photosensitive pn junction layer 50 is a border region between the n-type semiconductor layer 48 and the p-type semiconductor layer 52. Alternatively, the n-type semiconductor layer 48, the photosensitive pn junction layer 50, and the p-type semiconductor layer 52 may replaced by a single photosensitive layer made of any suitable photosensitive material.

The dielectric layer 54 may be made of $SiO_2$ or any other dielectric material, and has a thickness on the order of about 50 nm or less so that the metal layer 56 will be in close proximity to the photosensitive pn junction layer 50.

The metal layer 56 may be made of any metal suitable for use in a semiconductor sensor, such as Ag, Au, Al, Ni, or any other suitable metal. Ag has the lowest losses for surface plasmons (discussed below), but is more reactive than Au, so Au might be preferable to use even though it has higher losses for surface plasmons than Ag. The metal layer 56 has a thickness on the order of about 100 nm or less, but should be thick enough to be essentially opaque to light incident on the semiconductor sensor 40.

The metal layer 56 may be flat, wherein "flat" means that the metal layer 56 is intended to be a planar metal layer. However, any planar metal layer will in fact have a certain amount of surface roughness if examined at a sufficiently high magnification. Furthermore, the actual shape of the metal layer 56 will depend on the shape of the dielectric layer 54 on which the metal layer 56 is formed, which in turn will depend on the shapes of the other layers underlying the dielectric layer 54. Thus, the metal layer 56 may also be non-planar.

The fluorescent molecule layer 58 may be composed of any fluorescent molecules which absorb the incident light to be detected by the semiconductor sensor 40 and reradiates the light as fluorescence. For example, if infrared light is to be detected, the fluorescent molecule layer 58 is composed of fluorescent molecules that absorb infrared light. Organic dyes are particularly suited for use in the fluorescent molecule layer 58. Hundreds of suitable organic dyes are known in the art, and thus will not be listed here.

Quantum dots are ideal for use in the fluorescent molecule layer 58, but their cost may be prohibitive at present. However, the cost will almost certainly decrease as the use of quantum dots becomes more widespread. A quantum dot, also known as a semiconductor nanocrystal, is a semiconductor crystal whose size is on the order of a few nanometers to a few hundred nanometers, and which emits fluorescence when excited by incident light. The wavelength of the fluorescence depends on the size of the quantum dot, and is reddish for larger sizes and bluish for smaller sizes. Quantum dots having a range of sizes may be used to detect incident light having a range of wavelengths.

The fluorescent molecule layer 58 is shown conceptually in FIG. 2 as a single layer of molecules or quantum dots arranged in a regular pattern. However, in practice, the fluorescent molecule layer 58 will typically be several to many layers of molecules or quantum dots thick, and may be randomly arranged, rather than being arranged in a regular pattern.

The dielectric layer 60 may be made of $SiO_2$ or any other suitable dielectric material, or may be omitted if the fluorescent molecule layer 58 is adhered to the surface of the metal layer 56.

A photon 62 of incident light is absorbed by a fluorescent molecule 64 in the fluorescent molecule layer 58, exciting the fluorescent molecule 64 into a higher energy state, which then decays and emits fluorescence 66. The decay process generates a surface plasmon 68 at a metal/dielectric interface 70 between the metal layer 56 and the dielectric layer 54 by a near-field excitation process. In effect, the excited fluorescent molecule 64 can be said to have decayed radiatively by emitting the surface plasmon 68.

A surface plasmon can be thought of as a very highly attenuated guided wave that is constrained to follow a metal/dielectric interface, and is a combined oscillation of the electromagnetic field and the surface charges of the metal layer. A surface plasmon is not a light radiative state or a plane wave because its electric field profile decays exponentially away from the conducting layer/dielectric interface. The electric field of a surface plasmon is called an evanescent wave.

The surface plasmon 68 propagates along the metal/dielectric interface 70, and as it does so, its evanescent wave extends away from the metal/dielectric interface 70 into the metal layer 56, and extends away from the metal/dielectric interface 70 through the dielectric layer 54, the p-type semiconductor layer 52, and the photosensitive pn junction layer 50 into the n-type semiconductor layer 48. The evanescent wave has an electric field profile 72 that decays exponentially away from the metal/dielectric interface 70, with the portion extending into the metal layer 56 decaying faster than the portion extending into the n-type semiconductor layer 48 because the absorption losses in the metal layer 56 are higher than the absorption losses in the dielectric layer 54, the p-type semiconductor layer 52, the photosensitive pn junction layer 50, and the n-type semiconductor layer 48. The vertical dashed line toward which the electric field profile 72 decays represents an electric field of zero.

Although the surface plasmon 68 is shown as propagating from left to right in FIG. 2, this is merely conceptual, and the actual direction of propagation of the surface plasmon 68 may be different.

The portion of the evanescent wave of the surface plasmon 68 that extends through the photosensitive pn junction layer 50 generates an electron-hole pair in the photosensitive pn junction layer 50, and the electron contributes to a pixel light detection current $I_L$ generated in the photosensitive pn junction layer 50 in the pixel 44. The electrons constituting the pixel light detection current $I_L$ are collected by a charge collecting structure of the pixel 44. Such a charge collecting structure is known in the art, and thus is not shown in FIG. 2 for the sake of simplicity.

The depiction of the pixel light detection current $I_L$ in FIG. 2 and of all other pixel light detection currents in the figures is merely conceptual. The actual direction of the pixel light detection current depends on the design of the sensor.

Any incident light that is absorbed by the fluorescent molecule layer 58, such as the photon 62, is absorbed and converted to a pixel light detection current near the surface of the semiconductor sensor 40, and thus does not penetrate deeply into the semiconductor sensor 40 to cause optical and electronic crosstalk. Thus, the semiconductor sensor 40 is a shallow semiconductor sensor. In this context, "shallow" means that incident light is absorbed and converted to a light detection current in a shallow region of the semiconductor sensor 40.

Any incident light that is not absorbed by the fluorescent molecule layer 58, such as a photon 74, is reflected by the metal layer 56, and thus cannot penetrate into the semiconductor sensor 40 to cause optical or electronic crosstalk.

Although the semiconductor sensor 40 in FIG. 2 has been described in terms of detecting infrared light, the invention is not limited to detecting infrared light, and the semiconductor sensor 40 in FIG. 2 can be used to detect any desired wavelength of light or range of wavelengths of light by selecting the fluorescent molecules in the fluorescent molecule layer 58 to absorb the desired wavelength of light or range of wavelengths of light.

Figure 3:
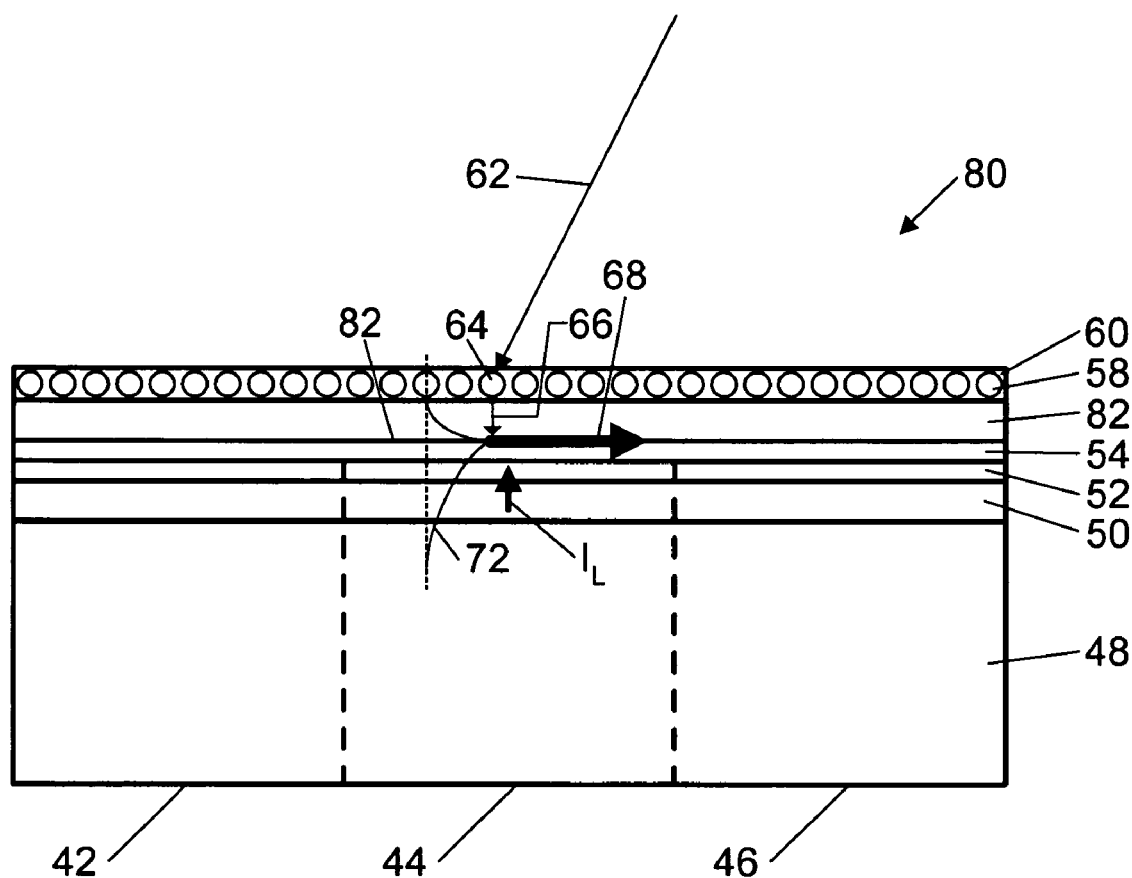
FIG. 3 shows a portion of another semiconductor sensor in accordance with the invention that eliminates optical and electronic cross talk.

FIG. 3 conceptually shows a portion of a semiconductor sensor 80 in accordance with the invention in which the metal layer 56 shown in FIG. 2 is replaced by a semiconductor layer 82 that forms a semiconductor/dielectric interface 84 with the dielectric layer 54. The semiconductor layer 82 may be made of Si, Ge, AlSb, GaSb, GaAs, GaP, InSb, InAs, InP, CdS, CdSe, ZnO, and ZnS or any other semiconductor capable of generating surface plasmons at the semiconductor/dielectric interface 84. The operation of the semiconductor sensor 80 in FIG. 3 is the substantially the same as the operation of the semiconductor sensor 40 in FIG. 2, except that the semiconductor layer 82 will not reflect any incident light that is not absorbed by the fluorescent molecule layer 58, in contrast to the metal layer 56 in FIG. 2 that will reflect such unabsorbed incident light, such as the photon 74 in FIG. 2.

Since the semiconductor layer 82 is formed over the dielectric layer 54, the semiconductor layer 82 will typically be amorphous rather than crystalline unless special processing techniques are employed. However, semiconductor layer 82 does not necessarily need to be crystalline because its only purpose is to generate surface plasmons in conjunction with the dielectric layer 54. The key requirement is that the real part of the complex permittivity of the semiconductor layer 82 must be negative at the wavelength of the fluorescence 66 emitted by the fluorescent molecule 64 of the fluorescent molecule layer 58 in order for the surface plasmon 68 to be generated.

Figure 4:
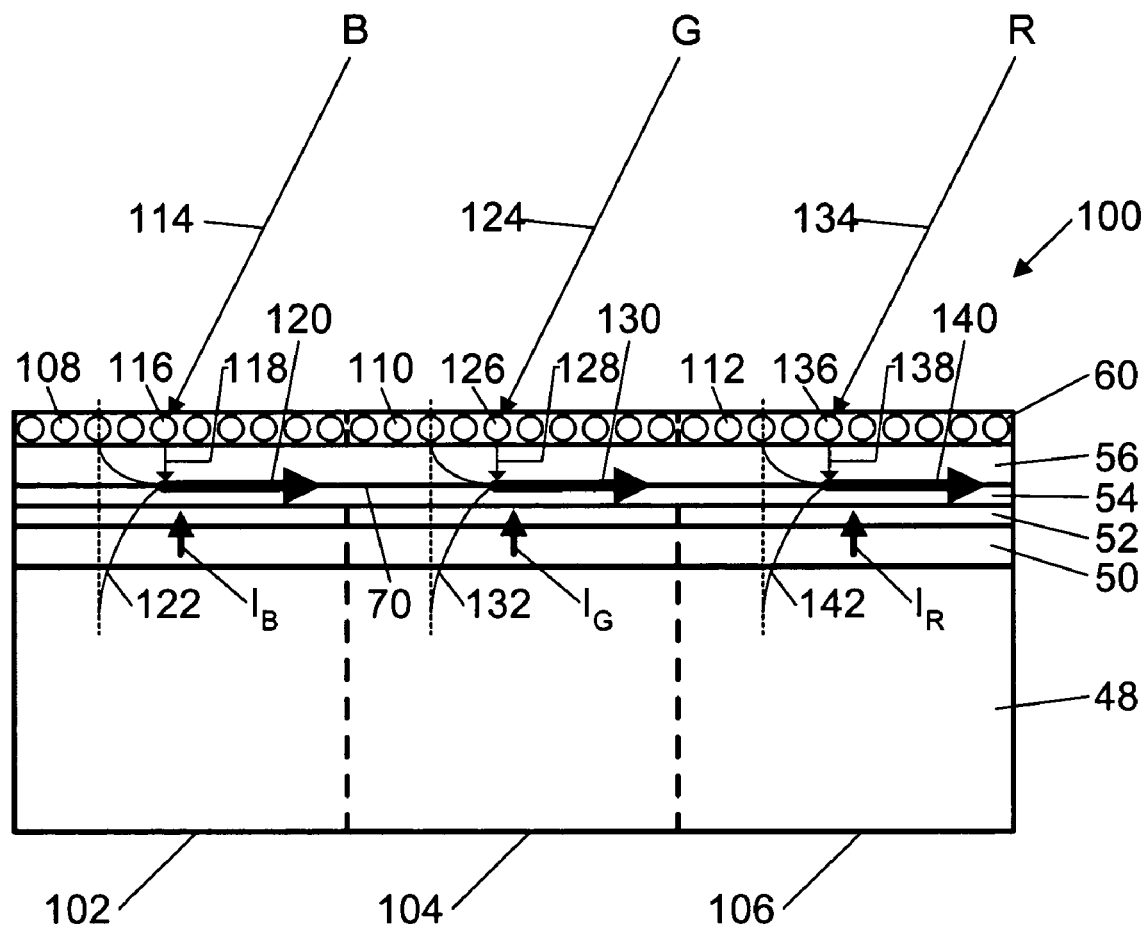
FIG. 4 shows a portion of a color semiconductor sensor in accordance with the invention that eliminates optical and electronic crosstalk.

FIG. 4 shows a portion of a color semiconductor sensor 100 in accordance with the invention that is a modification of the semiconductor sensor 40 in FIG. 2 and includes a blue pixel 102, a green pixel 104, and a red pixel 106. A blue-absorbing fluorescent molecule layer 108 overlies the blue pixel 102, a green-absorbing fluorescent molecule layer 110 overlies the green pixel 104, and a red-absorbing fluorescent molecule layer 112 overlies the red pixel 106.

A blue photon 114 of incident light is absorbed by a blue-absorbing fluorescent molecule 116 in the blue-absorbing fluorescent molecule layer 108, exciting the blue-absorbing fluorescent molecule 116 into a higher energy state, which then decays and emits fluorescence 118. The decay process generates a surface plasmon 120 at the metal/dielectric interface 70 between the metal layer 56 and the dielectric layer 54 by a near-field excitation process.

The surface plasmon 120 propagates along the metal/dielectric interface 70, and as it does so, its evanescent wave, which has an electric field profile 122, generates an electron-hole pair in the photosensitive pn junction layer 50, and the electron contributes to a blue pixel light detection current $I_B$ generated in the photosensitive pn junction layer 50 in the blue pixel 102. The electrons constituting the blue pixel light detection current $I_B$ are collected by a charge collecting structure of the blue pixel 102. Such a charge collecting structure is known in the art, and thus is not shown in FIG. 4 for the sake of simplicity.

A green photon 124 of incident light is absorbed by a green-absorbing fluorescent molecule 126 in the green-absorbing fluorescent molecule layer 110, exciting the green-absorbing fluorescent molecule 126 into a higher energy state, which then decays and emits fluorescence 128. The decay process generates a surface plasmon 130 at the metal/dielectric interface 70 between the metal layer 56 and the dielectric layer 54 by a near-field excitation process.

The surface plasmon 130 propagates along the metal/dielectric interface 70, and as it does so, its evanescent wave, which has an electric field profile 132, generates an electron-hole pair in the photosensitive pn junction layer 50, and the electron contributes to a green pixel light detection current $I_G$ generated in the photosensitive pn junction layer 50 in the green pixel 104. The electrons constituting the green pixel light detection current $I_G$ are collected by a charge collecting structure of the green pixel 104. Such a charge collecting structure is known in the art, and thus is not shown in FIG. 4 for the sake of simplicity.

A red photon 134 of incident light is absorbed by a red-absorbing fluorescent molecule 136 in the red-absorbing fluorescent molecule layer 112, exciting the red-absorbing fluorescent molecule 136 into a higher energy state, which then decays and emits fluorescence 138. The decay process generates a surface plasmon 140 at the metal/dielectric interface 70 between the metal layer 56 and the dielectric layer 54 by a near-field excitation process.

The surface plasmon 140 propagates along the metal/dielectric interface 70, and as it does so, its evanescent wave, which has an electric field profile 142, generates an electron-hole pair in the photosensitive pn junction layer 50, and the electron contributes to a red pixel light detection current $I_R$ generated in the photosensitive pn junction layer 50 in the red pixel 106. The electrons constituting the red pixel light detection current $I_R$ are collected by a charge collecting structure of the red pixel 106. Such a charge collecting structure is known in the art, and thus is not shown in FIG. 4 for the sake of simplicity.

Alternatively, the metal layer 56 in the color semiconductor sensor 100 in FIG. 4 may be replaced by the semiconductor layer 82 in FIG. 3 that will form a semiconductor/dielectric interface with the dielectric layer 54 in FIG. 3.

Although the color semiconductor sensor 100 in FIG. 4 has been described in terms of detecting blue, green, and red light, the invention is not limited to detecting blue, green, and red light, and the color semiconductor sensor 100 in FIG. 4 can be used to detect any desired wavelengths of light by selecting the fluorescent molecules in the fluorescent molecule layers 108, 110, and 112 to absorb the desired wavelengths of light. Also, only two colors of light may be detected by providing the color semiconductor sensor 100 with only two fluorescent molecule layers that absorb the two desired wavelengths of light, and more than three colors of light can be detected by providing the color semiconductor sensor 100 with additional fluorescent molecule layers that absorb the additional desired wavelengths of light.

Each of the fluorescent molecule layers in the color semiconductor sensor 100 may absorb a range of wavelengths. For example, in the specific example shown in FIG. 4, the blue-absorbing fluorescent molecule layer 108 may absorb wavelengths substantially in a range of 400 nm to 500 nm, the green-absorbing fluorescent molecule layer 110 may absorb wavelengths substantially in a range of 500 nm to 600 nm, and the red-absorbing fluorescent molecule layer 112 may absorb wavelengths substantially in a range of 600 nm to 700 nm. However, other wavelength ranges may be used, and there may be gaps between the ranges of wavelengths, or the ranges of wavelength may overlap.

Figure 5:
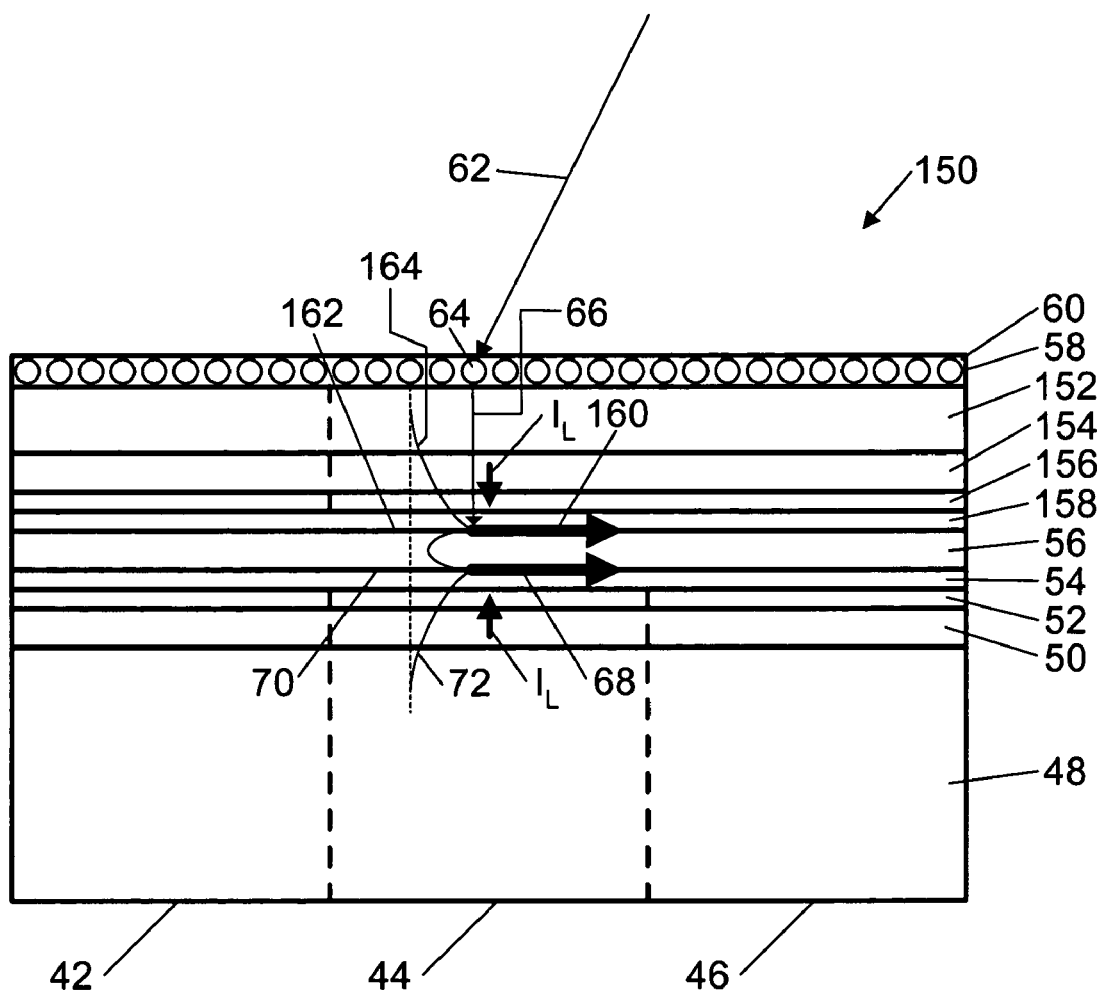
FIG. 5 shows a portion of a double-sided semiconductor sensor in accordance with the invention that eliminates optical and electronic crosstalk.

FIG. 5 conceptually shows a portion of a double-sided semiconductor sensor 150 in accordance with the invention that is a modification of the semiconductor sensor 40 in FIG. 2 and includes a second n-type semiconductor layer 152 substantially identical to the n-type semiconductor layer 48, a second photosensitive pn junction layer 154 substantially identical to the photosensitive pn junction layer 50, a second p-type semiconductor layer 156 substantially identical to the p-type semiconductor layer 52, and a second dielectric layer 158 substantially identical to the dielectric layer 54. The fluorescent molecule layer 58 and the dielectric layer 60 are formed on the second n-type semiconductor layer 152, rather than on the metal layer 56 as the semiconductor sensor 40 in FIG. 2. However, as discussed below, the second photosensitive pn junction layer 154 will typically be thinner than the photosensitive pn junction layer 50.

A photon 62 of incident light is absorbed by a fluorescent molecule 64 in the fluorescent molecule layer 58, exciting the fluorescent molecule 64 into a higher energy state, which then decays and emits fluorescence 66. The decay process generates the surface plasmon 68 at the metal/dielectric interface 70 between the metal layer 56 and the dielectric layer 54 by the near-field excitation process, and also generates a surface plasmon 160 at a second metal/dielectric interface 162 between the metal layer 56 and the second dielectric layer 158 by the near-field excitation process. In effect, the excited fluorescent molecule 64 can be said to have decayed radiatively by emitting the surface plasmons 68 and 160.

The second photosensitive pn junction layer 154 will typically be thinner than the photosensitive pn junction layer 50 because the distance between the fluorescent molecule layer 58 and the metal/dielectric interface 162 must be less than about one wavelength of the fluorescence 66 emitted in order for the near-field excitation process to occur.

The surface plasmon 68 propagates along the metal/dielectric interface 70, and as it does so, its evanescent wave extends away from the metal/dielectric interface 70 into the metal layer 56, and extends away from the metal/dielectric interface 70 through the dielectric layer 54, the p-type semiconductor layer 52, and the photosensitive pn junction layer 50 into the n-type semiconductor layer 48. The evanescent wave of the surface plasmon has an electric field profile 72 that decays exponentially away from the metal/dielectric interface 70, with the portion extending into the metal layer 56 decaying faster than the portion extending into the n-type semiconductor layer 48 because the absorption losses in the metal layer 56 are higher than the absorption losses in the dielectric layer 54, the p-type semiconductor layer 52, the photosensitive pn junction layer 50, and the n-type semiconductor layer 48. The vertical dashed line toward which the electric field profile 72 decays represents an electric field of zero.

The portion of the evanescent wave of the surface plasmon 68 that extends through the photosensitive pn junction layer 50 generates an electron-hole pair in the photosensitive pn junction layer 50, and the electron contributes to a pixel light detection current $I_L$ generated in the photosensitive pn junction layer 50 in the pixel 44. The electrons constituting the pixel light detection current $I_L$ are collected by a charge collecting structure in the lower portion of the pixel 44 shown in FIG. 5. Such a charge collecting structure is known in the art, and thus is not shown in FIG. 5 for the sake of simplicity.

Likewise, the surface plasmon 160 propagates along the second metal/dielectric interface 162, and as it does so, its evanescent wave extends away from the second metal/dielectric interface 162 into the metal layer 56, and extends away from the second metal/dielectric interface 162 through the second dielectric layer 158, the second p-type semiconductor layer 156, and the second photosensitive pn junction layer 154 into the second n-type semiconductor layer 152. The evanescent wave of the surface plasmon 160 has an electric field profile 164 that decays exponentially away from the second metal/dielectric interface 162, with the portion extending into the metal layer 56 decaying faster than the portion extending into the second n-type semiconductor layer 152 because the absorption losses in the metal layer 56 are higher than the absorption losses in the second dielectric layer 158, the second p-type semiconductor layer 156, the second photosensitive pn junction layer 154, and the second-type semiconductor layer 152. The vertical dashed line toward which the electric field profile 164 decays represents an electric field of zero.

The portion of the evanescent wave of the surface plasmon 160 that extends through the second photosensitive pn junction layer 154 generates an electron-hole pair in the second photosensitive pn junction layer 154, and the electron contributes to a pixel light detection current $I_L$ generated in the second photosensitive pn junction layer 154 in the pixel 44. The electrons constituting the pixel light detection current $I_L$ are collected by a charge collecting structure in the upper part of the pixel 44 shown in FIG. 5. Such a charge collecting structure is known in the art, and thus is not shown in FIG. 5 for the sake of simplicity.

If the metal layer 56 is thinner than about 100 nm, the electric field of the surface plasmon 68 can couple with the electric field of the surface plasmon 160 inside the metal layer 56, forming a combined electric field having an electric field profile as shown in FIG. 5 and generating a coupled surface plasmon. FIG. 5 shows one possible coupling state in which the electric fields of the surface plasmons 68 and 160 in the metal layer 56 have the same polarity, so the combined electric field in the metal layer 56 never goes to zero. There is another possible coupling state in which the electric fields of the surface plasmons 68 and 160 have opposite polarities in the metal layer 56, so the combined electric field in the metal layer 56 does go to zero.

In the semiconductor sensor 150 in FIG. 5, the second n-type semiconductor layer 152 that is adjacent to the fluorescent molecule layer 58 will not reflect any incident light that is not absorbed by the fluorescent molecule layer 58, in contrast to the metal layer 56 in FIG. 2 that is adjacent to the fluorescent molecule layer 58 and will reflect such unabsorbed incident light, such as the photon 74 in FIG. 2.

The semiconductor sensor 150 in FIG. 5 may be fabricated as two separate wafers which bonded together using any suitable bonding technique known in the art. For example, a first wafer may be fabricated to include the n-type semiconductor layer 48, the photosensitive pn junction layer 50, the p-type semiconductor layer 52, the dielectric layer 54, and the metal layer 56, and a second wafer may be fabricated to include the fluorescent molecule layer 58, the dielectric layer 60, the second n-type semiconductor layer 152, the second photosensitive pn junction layer 154, the second p-type semiconductor layer 156, and the second dielectric layer 158. Alternatively, the metal layer 56 may be included in the second wafer instead of in the first wafer. Alternatively, the fluorescent molecule layer 58 and the dielectric layer 60 may be omitted from the second wafer and may be formed on the second n-type semiconductor layer 152 after the first wafer and the second wafer have been bonded together.

Alternatively, the metal layer 56 in the semiconductor sensor 150 in FIG. 5 may be replaced by the semiconductor layer 82 in FIG. 3 that will form a semiconductor/dielectric interface with the dielectric layer 54 in FIG. 5 and will form a second semiconductor/dielectric interface with the second dielectric layer 158 in FIG. 5.

The double-sided structure of the double-sided semiconductor sensor 150 in FIG. 5 may be applied to the color semiconductor sensor 100 in FIG. 4 to produce a double-sided color semiconductor sensor.

Although the semiconductor sensors in FIGS. 2-5 are designed to eliminate optical and electronic crosstalk, they may be susceptible to a new kind of crosstalk called surface plasmon crosstalk. Surface plasmons will typically propagate 10 to 50 μm. Referring, for example, to FIG. 2, if the width of the pixels 42, 44, and 46 is less than the propagation distance of the surface plasmons generated at the metal/dielectric interface 70, there is a possibility that the surface plasmon 68 generated in the pixel 44 by the photon 62 incident onto the pixel 44 will not generate an electron-hole pair in the pixel 44, but will propagate into the neighboring pixel 46 and generate an electron-hole pair in the pixel 46 which will contribute to the pixel light detection current $I_L$ generated in the pixel 46. This will distort the pixel light detection currents $I_L$ generated in the pixels 44 and 46, making the pixel light detection current $I_L$ generated in the pixel 44 smaller than it should be, and making the pixel light detection current $I_L$ generated in the pixel 46 larger than it should be.

Figure 6:
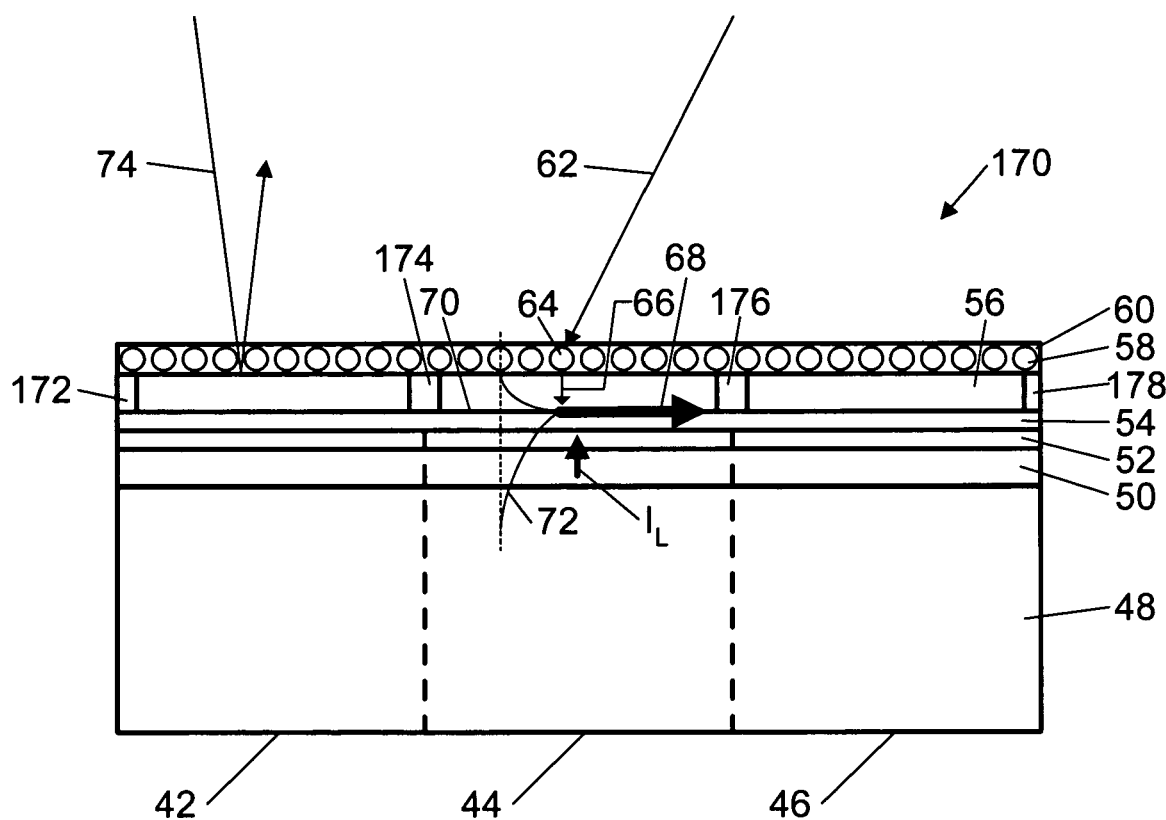
FIG. 6 shows a portion of a semiconductor sensor in accordance with the invention that eliminates optical, electronic, and surface plasmon crosstalk.

FIG. 6 shows a semiconductor sensor 170 in accordance with the invention that is a modification of the semiconductor sensor 40 in FIG. 2 in which the metal layer 56 is patterned to leave gaps in the metal layer 56 at the boundaries of the pixels 42, 44, and 46 to eliminate surface plasmon crosstalk. Surface plasmons generated in one pixel cannot propagate across the gap in the metal layer 56 at the boundary of the pixel to a neighboring pixel, and therefore surface plasmon crosstalk cannot occur. The gaps in the metal layer 56 may be filled with a material to create a separator to provide an even surface for forming the fluorescent molecule layer 58 and the dielectric layer 60 on the metal layer 56. The material filling the gaps may be the same material as the material of the dielectric layer 60, or may be any suitable material. Filling the gaps with an opaque material will block any incident light that is not absorbed by the fluorescent molecule layer 64 from penetrating into the pixels and causing optical and/or electronic crosstalk.

FIG. 6 shows a separator 172 filling a gap in the metal layer 56 at the boundary between the pixel 42 and a neighboring pixel to the left, a separator 174 filling a gap in the metal layer 56 at the boundary between the pixels 42 and 44, a separator 176 filling a gap in the metal layer 56 at the boundary between the pixels 44 AND 46, and a separator 178 filling a gap in the metal layer 56 at the boundary between the pixel 46 and a neighboring pixel to the right.

If the semiconductor sensor 170 is a two-dimensional sensor, gaps filled with separators are also formed in the metal layer 56 at boundaries between pixels extending in the direction perpendicular to the plane of the paper in FIG. 6. Thus, the metal layer 56 will consist of an array of individual metal pieces surrounded by gaps filled with separators at the pixel boundaries. Depending on the design of the semiconductor sensor 170, the individual metal pieces may be square, rectangular, or any other suitable shape.

The width of the gaps in the metal layer 56 may depend on the size of the pixels, and may have any suitable width that is achievable with the fabrication technology being used to manufacture the semiconductor sensor 170. For example, the gaps may typically be from 0.5 μm to 1.0 μm wide, but may be made as small as 0.1 μm if necessary if the pixels are very small.

The semiconductor layer 82 in the semiconductor sensor 80 in FIG. 3, the metal layer 56 in the color semiconductor sensor 100 in FIG. 4, and the metal layer 56 in the double-sided semiconductor sensor 150 in FIG. 5 may also be patterned to have gaps filled with separators at the boundaries between the pixels like the metal layer 56 in the semiconductor sensor 170 in FIG. 6

Although several embodiments in accordance with the invention have been shown and described, it would be appreciated by those skilled in the art that changes may be made in these embodiments without departing from the principles and spirit of the invention, the scope of which is defined in the claims and their equivalents.

What is claimed is:

1. A sensor comprising:
   a fluorescent molecule layer that converts light incident on the sensor to surface plasmons;
   a first photosensitive layer that generates a light detection signal representative of the light incident on the sensor in response to the surface plasmons;
   a metal layer disposed between the fluorescent molecule layer and the first photosensitive layer;
   a first dielectric layer disposed between the metal layer and the first photosensitive layer;
   a second photosensitive layer disposed between the fluorescent molecule layer and the metal layer; and
   a second dielectric layer disposed between the second photosensitive layer and the metal layer.

2. The sensor of claim 1, wherein each of the first photosensitive layer and the second photosensitive layer is a photosensitive pn junction layer.

3. The sensor of claim 1, wherein the metal layer is flat.

4. The sensor of claim 1, wherein the metal layer is non-planar.

5. The sensor of claim 1, wherein the metal layer is substantially opaque to the light incident on the sensor.

6. The sensor of claim 1, wherein a thickness of the metal layer is 100 nm or less.

7. The sensor of claim 1, wherein the metal layer contacts the first dielectric layer to form a metal/dielectric interface; and
   wherein the surface plasmons propagate along the metal/dielectric interface, and have an electric field that extends through the first dielectric layer into the first photosensitive layer and generates the light detection signal in the first photosensitive layer.

8. The sensor of claim 1, wherein the sensor includes a plurality of pixels, and the metal layer has gaps at boundaries between the pixels which prevent the plasmons from propagating into adjacent pixels.

9. The sensor of claim 8, further comprising separators filling the gaps.

10. The sensor of claim 9, wherein the separators are substantially opaque to the light incident on the sensor.

* * * * *